United States Patent [19]

Nariani et al.

[11] Patent Number: 5,128,279
[45] Date of Patent: Jul. 7, 1992

[54] CHARGE NEUTRALIZATION USING SILICON-ENRICHED OXIDE LAYER

[75] Inventors: Subhash R. Nariani, San Jose; Dipankar Pramanik, Cupertino, both of Calif.

[73] Assignee: VLSI Technology, Inc., San Jose, Calif.

[21] Appl. No.: 776,503

[22] Filed: Oct. 11, 1991

Related U.S. Application Data

[62] Division of Ser. No. 476,089, Mar. 5, 1990, Pat. No. 5,057,897.

[51] Int. Cl.$^5$ ............................................. H01L 21/90
[52] U.S. Cl. ...................................................... 437/195
[58] Field of Search ......................................... 437/195

[56] References Cited

U.S. PATENT DOCUMENTS

| | | | |
|---|---|---|---|
| 4,123,565 | 10/1978 | Sumitomo et al. | 427/88 |
| 4,381,595 | 5/1983 | Deuda et al. | 437/195 |
| 4,502,202 | 3/1985 | Malhi | 29/571 |
| 4,613,888 | 9/1986 | Mase et al. | 357/54 |

OTHER PUBLICATIONS

Yoshida, et al., Improvement of Endurance to Hot Carrier Degradation by Hydrogen Blocking P-SiO, IEDM 1988, pp. 22-25.

Primary Examiner—Robert Kunemund
Assistant Examiner—Andrew Griffis
Attorney, Agent, or Firm—Clifton L. Anderson

[57] ABSTRACT

Parasitic leakage is minimized in a MOS structure. An integrated circuit wafer comprises conventional MOS elements as applied through a first level metallization. An intermetal dielectric includes three layers, an intermediate organic glass layer used for planarization and upper and lower oxide layers. A second metallization is applied over the dielectric. Passivation includes a lower oxide passivation and an upper nitride passivation. Hydrogen from the nitride passivation migrates into the organic glass and forms positive charges that induce the parasitic leakage. The lower oxide layer in the intermetal dielectric is silicon-enriched to provide dangling bonds which neutralize this charge formation and thus minimize the parasitic leakage.

5 Claims, 2 Drawing Sheets

CHARGE NEUTRALIZATION USING SILICON-ENRICHED OXIDE LAYER

BACKGROUND OF THE INVENTION

This is a divisional of allowed U.S. patent application Ser. No. 07/476,089, filed Mar. 5, 1990 now U.S. Pat. No. 5,057,897.

The present invention relates to integrated circuits and related multilayer structures and, more particular, to such structures incorporating organic glass layers or other carbon-bearing elements. A major objective of the present invention is to reduce parasitic leakage in silicon based integrated circuits incorporating organic glass layers within an intermetal dielectric and a nitride layer in a passivation structure.

Much of modern technological progress is identified with the development of integrated circuits, which provide levels of functionality in a small space and require relatively small amounts of power. The integrated circuits generally comprise a large number of devices fabricated into a substrate and electrically isolated, usually by thermally grown field oxides.

The devices, e.g., transistors, are interconnected using metal patterns formed over the substrate. Typically, at least two metallization levels and an intermetal dielectric are required so that conductive traces can cross each other without shorting. Where connections between the levels are desired, vias can be formed through the dielectric and filled with conductive material.

The metallization patterns defined in each metallization level can be defined photolithographically. The surfaces over which conductive leads are to be formed are preferably as flat as possible to maximize the precision of the photolithography. The desired flatness can be difficult to achieve beyond the first metallization layer because subsequently formed layers, e.g., oxide intermetal dielectric layers, tend to conform to the topology of the pattern in the first metallization layer and any other surface features, e.g., polycrystalline gates, formed on the substrate.

An organic glass layer can be included within an intermetal dielectric structure to provide a flatter surface upon which a subsequent metal pattern can be defined. Thus, an intermetal dielectric structure can include an organic glass layer sandwiched between two oxide layers. The organic glass can be spun on so that it tends to fill in the "valleys" in the surface below. The oxide layer above the glass is then physically buffered from the topology below the glass and thus serves as a better foundation for the photolithographic definition of the next metal pattern. The planarization process can be repeated to accommodate any third or higher level metallizations.

Once the final metallization layer is deposited and the desired pattern defined therein, it is generally desired to protect the exposed metal with a passivation structure. Passivation structures including an oxide layer followed by a nitride layer have proved effective at protecting the underlying structure from environmental attack. In accordance with the foregoing consideration, a particularly useful integrated circuit structure comprises a conventional device through a first metal level, an intermetal dielectric structure including an organic glass sandwiched between two oxide layers, a second metal level, and a passivation structure including a nitride layer over an oxide layer.

Such structures have been found to have a problem with parasitic leakage. In other words, currents applied to one device of the integrated circuit structure are unintentionally diverted to neighboring devices. Presumably, current travels under the field oxides, which are failing their objective of electrically isolating devices. Parasitic leakage impairs performance in individual integrated circuits. On a statistical basis, excessive parasitic leakage lowers yields and, correspondingly, raise manufacturing costs. From a design perspective, circuit miniaturization is limited because the parasitic leakage places a lower bound on the minimum lateral size for field oxides; smaller field oxides would increase parasitic leakage.

What is needed is, first, to identify at least some of the factors contributing to parasitic leakage. Then, an approach to minimizing parasitic leakage needs to be determined. Preferably, this approach would be compatible with conventional processing procedures and be otherwise economical.

SUMMARY OF THE INVENTION

In accordance with the present invention, an organic glass, or other carbon-bearing layer, is formed over a silicon-enriched oxide layer. In the case of an integrated circuit structure, placing the enriched-silicon oxide layer between the substrate and the carbon-bearing layer minimizes parasitic leakage in the devices formed in the substrate. As explained below, the parasitic leakage occurs as a result of hydrogen migration from a nitride passivation layer into the carbon-bearing layer; the hydrogen interacts with the carbon to form a charged species which is neutralized by the silicon-enriched oxide layer below.

In the course of the present invention, it was considered that the problems encountered were related to hot electron effects reported by Yoshida S. et al, "Improvement of Endurance to Hot Carrier Degradation by Hydrogen Blocking P-SiO", *International Electron Devices Meeting Digest*, 1988, pp. 22–25. This reference discloses applying a silicon-enriched passivation layer under a nitride passivation layer to limit hydrogen migration therefrom that tended to damage the devices the passivation was intended to protect.

In the context of the integrated circuit structure, the utilization of a silicon-enriched passivation oxide provides an inadequate improvement. A further, but still adequate, gain is obtained by additionally making the dielectric layer above the carbon-bearing glass silicon rich. In analyzing these results, it is believed that the hydrogen blocking effect of enriched silicon dioxide is quite limited. This blocking effect has been shown to be adequate to slow the hot carrier degradation addressed by Yoshida et al., but insufficient for substantial reduction of the parasitic leakage of concern herein.

Surprisingly, using a silicon-enriched oxide below the carbon-bearing layer proved to be the key to lowering parasitic leakage. Further improvements can be obtained by using silicon-enriched oxides above the carbon-bearing layer, but even without these enhancements, the silicon-enriched oxide below and in contact with the carbon-bearing layer is relatively dramatic. The enriched silicon can be formed using a plasma deposition with excess silicon over that required for a stochiometric deposition, and/or performing the deposition at lower temperature and/or lower power.

By way of explanation, and not of limitation, the following mechanism is presented. During various thermal events, hydrogen migrates from the nitride layer down toward the substrate and into the carbon-bearing layer. The hydrogen interacts with the carbon to form a positive charged species which establishes an electric field at the lower boundary of the carbon bearing layer. This charged layer induces an opposing charged layer at the boundary of the field oxide and the substrate. The charged layer acts as a current path between adjacent devices, breaking down the isolation the field oxides were intended to establish. In other words, parasitic leakage is induced by the positive charges formed in the carbon-bearing layer. The extra silicon at the lower boundary of the carbon-bearing layer neutralizes the charges thereat, and thus, minimizes the fields at the field oxide. Device isolation is thus restored.

The effect of the enriched-silicon oxide below the carbon-bearing layer operates in a manner distant from enriched-silicon oxides above the carbon bearing layer. The silicon-enriched layers above the carbon-bearing layer reduce hydrogen migration, yet enough hydrogen enters the carbon-bearing layers to create the undesired charge. The silicon-enriched layer below the carbon-bearing layer also partially blocks hydrogen migration into the substrate. However, this migration is not what causes parasitic leakage. It is the neutralization of the charges at the lower boundary of the carbon-bearing layer that is the unique function of the excess silicon in the lower oxide. It is this function that prevents the breakdown of field isolation. These and other features and advantages of the present invention are apparent from the description below with reference to the following drawings.

DESCRIPTION OF THE PREFERRED EMBODIMENTS

Figure 1:
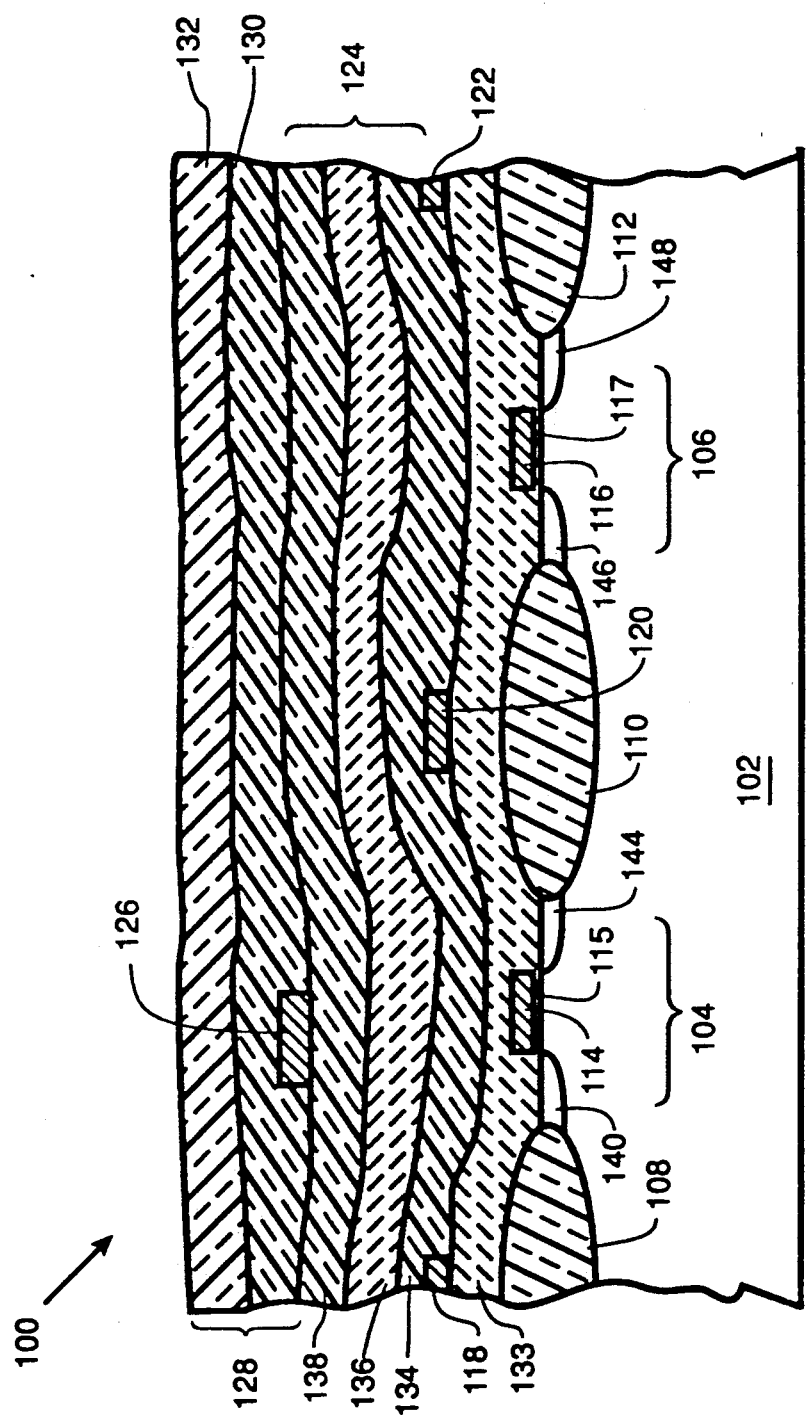
FIG. 1 is a sectional view of an integrated circuit wafer in accordance with the present invention.

In accordance with the present invention, an integrated circuit wafer 100 comprises a substrate 102 with active device regions 104 and 106, field oxides 108, 110, and 112, polysilicon gates 114 and 116 overlaying gate oxides 115 and 117, a first level metal pattern including conductors 118, 120 and 122, an intermetal dielectric 124, a second level metal pattern including conductor 126, and a passivation structure 128. Passivation structure 128 includes a lower oxide passivation 130 and an upper nitride passivation 132, as shown in FIG. 1. Intermetal dielectric 124 includes a lower oxide layer 134, an organic glass layer 136 and an upper oxide layer 138. A boro-phosphorous silicate glass (BPSG) layer 133 insulates the first metal layer from gates 114 and 116. Device region 104 includes a drain 140, and source 144; device region 106 includes a source 146, and a drain 148. Interconnects to the sources, drains and gates are provided, but are not visible in the section of FIG. 1.

Nitride passivation 132 is a source of hydrogen which can migrate into organic glass layer 136, which includes carbon. This migration is partially blocked using silicon-enriched oxides for oxide passivation 130 and upper oxide layer 138. Surprisingly, however, it is the use of the silicon-enriched oxide in lower oxide layer 134 that has the most substantial effect on limiting parasitic leakage.

Figure 2:
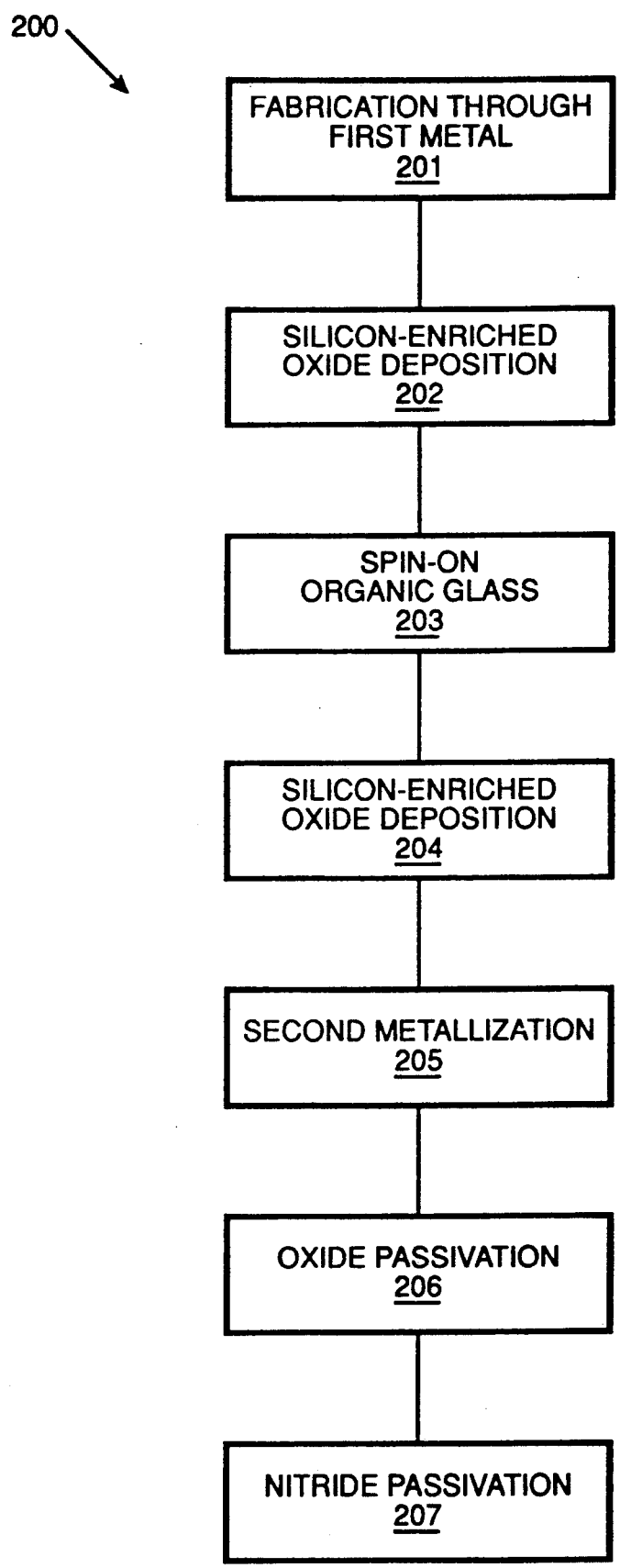
FIG. 2 is a flow chart of a method for manufacturing the structure of FIG. 1.

Processing integrated circuit wafer 100, as indicated at 200 in FIG. 2, is conventional through the first metallization, indicated at step 201. Field oxides 108, 110, and 112 are photolithographic defined from a thick oxide grown on substrate 102. A thin oxide is then grown and gates 114 and 116 are photolithographically defined in a layer of polysilicon. The thin oxide is removed except under the remaining polysilicon to define gate oxides 115 and 117. Aluminum is then photolithographically patterned to define the first metallization including conductors 118, 120 and 122.

The primary deviations from conventional processing is the use of enriched-silicon in the lower intermetal oxide layer 134. During plasma deposition, at 202, more silicon-bearing reagent than is required for stochiometric interaction with the introduced oxidant is used so that the resulting deposition is silicon enriched. During deposition, the r.f. plasma power is kept relatively low.

Organic glass is then spun on, at 203, to define layer 136, which provides planarization for subsequent the second metallization. Upper intermetal oxide layer 138 is then deposited, at 204, over organic glass layer 136. Using the techniques applied to lower oxide layer 134, upper oxide layer 138 is silicon enriched to provide some hydrogen blockage to organic glass layer 136. Second metallization, including conductor 126 is then defined photolithographically, at 205. Oxide passivation 130, also enriched as described above, is applied, at 206. Nitride passivation 132 is then applied, at 207, through plasma deposition.

The degree of silicon enrichment in lower oxide layer 134 has a strong bearing on the reduction of parasitic leakage. The effectiveness of charge neutralization is strongly correlated with the density of dangling bonds, which are available on silicon atoms bonded with fewer than four oxygen atoms. Dangling bond density can be assessed by measuring spin density using an electron spin resonance spectrometer. A spin density of at least about $10^{17}$ per $cm^3$ should be achieved, although $10^{18}$ is a more practical minimum. Preferably, the density should be at least about $10^{19}$ per $cm^3$. This is compared to a spin density of less than $10^{16}$ per $cm^3$ in unenriched oxides.

A related comparison is a preferred Si-H absorbance of at least about 0.010 versus an unenriched level of about 0.001 or less as measured in the infrared spectrum as a peak located near the wave number 2250 for a 1.0 micron thick film. A further comparison is of a preferred refractive index of at least about 1.50 versus about 1.46 +/− 0.02 as measured by an elliposmeter.

The present invention is described above in the context of a particular integrated circuit structure. Those skilled in the art can recognize its applicability to other structures. The source of hydrogen can be generalized, and need not be limited to a nitride passivation layer. The problems to be addressed need not be limited to loss of field isolation. Other field sensitive effects can be addressed. Accordingly, the present invention can be applied to a wide variety of structures in which charge generation due to hydrogen reacting with a carbon-bearing object needs to be minimized. These and other variations upon and modifications to the disclosed embodiments are provided for by the present invention, the scope of which is limited only by the following claims:

What is claimed is:

1. In the manufacture of an integrated circuit structure including a substrate, an intermetal dielectric having an organic glass layer and a passivation structure including a nitride layer, a method of limiting charge in the resulting integrated circuit structure, said method comprising:

forming a silicon-enriched oxide intermetal dielectric layer over a first-level metallization and said substrate; and forming said organic glass layer directly over said silicon-enriched oxide layer.

2. A method as recited in claim 1 wherein said silicon-enriched oxide layer contains a spin density of at least about $10^{17}$ per cm$^3$.

3. The method of claim 1 further comprising forming an additional silicon-enriched oxide dielectric layer over said organic glass layer.

4. The method of claim 1 further comprising forming a silicon-enriched oxide passivation layer over a second-level metallization and then forming said nitride passivation layer on said silicon-enriched oxide passivation layer.

5. The method of claim 1 wherein said silicon-enriched oxide intermetal dielectric layer is formed using a plasma deposition in which a silicon-bearing reactant is presented in amount relative to oxygen-bearing reactant above that required for stochiometric silicon dioxide formation.

* * * * *